(12) United States Patent
Flores Renteria et al.

(10) Patent No.: US 11,078,574 B2
(45) Date of Patent: Aug. 3, 2021

(54) MULTILAYERED ALUMINIFEROUS PROTECTIVE COATING AND COMPONENT

(71) Applicant: Siemens Aktiengesellschaft, Munich (DE)

(72) Inventors: Arturo Flores Renteria, Berlin (DE); Simone Friedle, Wuppertal (DE); Torsten Neddemeyer, Falkensee (DE)

(73) Assignee: SIEMENS ENERGY GLOBAL GMBH & CO. KG

( * ) Notice: Subject to any disclaimer, the term of this patent is extended or adjusted under 35 U.S.C. 154(b) by 0 days.

(21) Appl. No.: 16/347,947

(22) PCT Filed: Nov. 7, 2017

(86) PCT No.: PCT/EP2017/078455
§ 371 (c)(1),
(2) Date: May 7, 2019

(87) PCT Pub. No.: WO2018/087080
PCT Pub. Date: May 17, 2018

(65) Prior Publication Data
US 2019/0352782 A1 Nov. 21, 2019

(30) Foreign Application Priority Data
Nov. 14, 2016 (DE) ...................... 10 2016 222 296.1

(51) Int. Cl.
*B32B 15/04* (2006.01)
*B32B 15/18* (2006.01)
(Continued)

(52) U.S. Cl.
CPC ............. *C23C 28/42* (2013.01); *B32B 15/043* (2013.01); *B32B 15/18* (2013.01); *B32B 15/20* (2013.01);
(Continued)

(58) Field of Classification Search
CPC ....... C23C 28/42; C23C 28/34; C23C 28/321; C23C 14/0641; F01D 5/288; B32B 15/20;
(Continued)

(56) References Cited

U.S. PATENT DOCUMENTS

| 8,118,983 B1 | 2/2012 | Anderson |
| 2006/0018760 A1 | 1/2006 | Bruce et al. |

(Continued)

FOREIGN PATENT DOCUMENTS

| CN | 101619459 A | 1/2010 |
| CN | 104441814 A | 3/2015 |

(Continued)

OTHER PUBLICATIONS

Chen Li et al: "Effect of bilayer period on structure, mechanical and thermal properties of TiAlN/AlTiN multilayer coatings", Thin Solid Films, vol. 592, pp. 207-214, XP055436295, Amsterdam, NL, ISSN: 0040-6090, DOI: 10.1016/j.tsf.2015.09.029, sections 1, 2, summary; 2015; 8 pages.

(Continued)

*Primary Examiner* — Daniel J. Schleis
*Assistant Examiner* — Kevin C T Li
(74) *Attorney, Agent, or Firm* — Schmeiser, Olsen & Watts LLP

(57) ABSTRACT

The use of especially an aluminum alloy on a metal substrate in a PVD-AlTiN coating results in good corrosion and erosion protection.

8 Claims, 1 Drawing Sheet

(51) Int. Cl.
  *B32B 15/20* (2006.01)
  *C23C 14/06* (2006.01)
  *C23C 28/00* (2006.01)
  *F01D 5/28* (2006.01)
(52) U.S. Cl.
  CPC ........ *C23C 14/0641* (2013.01); *C23C 28/321* (2013.01); *C23C 28/34* (2013.01); *F01D 5/288* (2013.01); *F05D 2300/121* (2013.01); *F05D 2300/134* (2013.01); *F05D 2300/611* (2013.01)
(58) Field of Classification Search
  CPC . B32B 15/18; B32B 15/043; F05D 2300/134; F05D 2300/121; F05D 2300/611
  See application file for complete search history.

(56) References Cited

U.S. PATENT DOCUMENTS

| | | | |
|---|---|---|---|
| 2007/0190351 | A1 | 8/2007 | Eichmann et al. |
| 2008/0057327 | A1 | 3/2008 | Fang et al. |
| 2008/0118643 | A1* | 5/2008 | Feuerstein ............ C23C 28/044 427/255.394 |
| 2009/0123737 | A1 | 5/2009 | Yasui et al. |
| 2016/0090654 | A1* | 3/2016 | Liu ...................... C23C 28/042 428/336 |
| 2016/0175939 | A1 | 6/2016 | Tanaka et al. |
| 2017/0009591 | A1 | 1/2017 | Flores Renteria et al. |
| 2018/0223436 | A1 | 8/2018 | Schier |

FOREIGN PATENT DOCUMENTS

| | | | | |
|---|---|---|---|---|
| CN | 105473261 | A | 4/2016 | |
| DE | 102004001392 | A1 | 8/2005 | |
| DE | 112006003471 | T5 | 12/2008 | |
| DE | 112009002080 | B4 | 7/2011 | |
| DE | 112009002080 | B4 | 2/2016 | |
| DE | 112006003471 | B4 | 2/2017 | |
| EP | 2684982 | A1 | 1/2014 | |
| EP | 2907888 | A1 | 8/2015 | |
| EP | 3018233 | A1 | 5/2016 | |
| EP | 3018233 | A1 * | 5/2016 | ........... C23C 14/024 |
| JP | H0797679 | | 4/1995 | |
| JP | 2979921 | B2 | 11/1999 | |
| JP | 2008138242 | A | 6/2008 | |
| JP | 2013221215 | A | 10/2013 | |
| KR | 20070015965 | A | 2/2007 | |
| WO | 2009031958 | A1 | 3/2009 | |
| WO | WO 2009031958 | A1 | 3/2009 | |
| WO | WO-2009031958 | A1 * | 3/2009 | ........... C23C 28/044 |

OTHER PUBLICATIONS

PCT International Search Report and Written Opinion of International Searching Authority dated Jan. 9, 2018 in corresponding to PCT International Application No. PCT/EP2017/078455 filed Nov. 7, 2017. 15 pages.
Chen Li et al: "Effect of bilayer period on structure, mechanical and thermal properties of TiAlN/AlTiN multilayer coatings", Thin Solid Films, vol. 592, pp. 207-214, XP055436295, Amsterdam, NL, ISSN: 0040-6090, DOI: 10.1016/j.tsf.2015.09.029, sections 1, 2, summary; 2015.
*PCT International Search Report and Written Opinion of International Searching Authority dated Jan. 9, 2018 corresponding to PCT International Application No. PCT/EP2017/078455 filed Nov. 7, 2017.*
Korean Office Action dated Sep. 2, 2020 for Application No. 10-2019-7016670.
Non-English Chinese Office Action dated Aug. 5, 2020 for Application No. 201780070597.9.
Chinese Notice of Allowance dated Oct. 28, 2020 for Application No. 201780070597.9.
Korean Office Action dated Mar. 12, 2021 for Application No. 10-2019-7016670.

\* cited by examiner

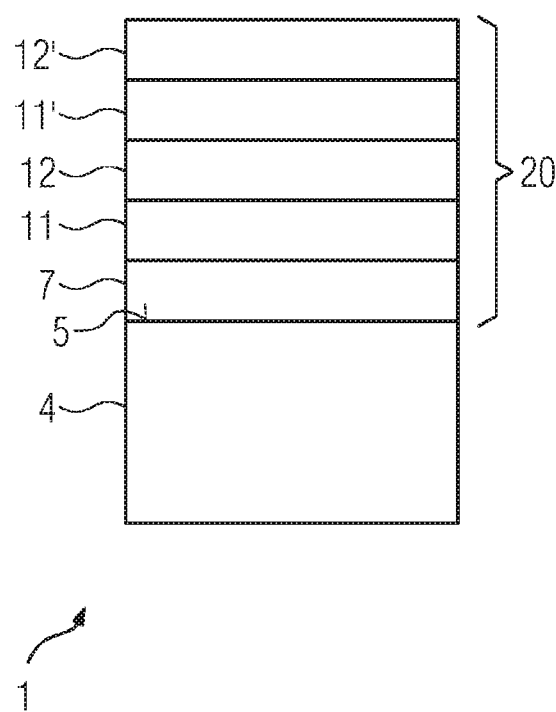

MULTILAYERED ALUMINIFEROUS PROTECTIVE COATING AND COMPONENT

CROSS-REFERENCE TO RELATED APPLICATIONS

This application claims priority to PCT Application No. PCT/EP2017/078455, having a filing date of Nov. 7, 2017, which is based on German Application No. 10 2016 222 296.1, having a filing date of Nov. 14, 2016, the entire contents both of which are hereby incorporated by reference.

FIELD OF TECHNOLOGY

The following relates to a protective coating which is formed in at least two layers, and to a corresponding component for it.

BACKGROUND

In order to protect compressor components of gas turbines against corrosive action a high-temperature lacquer containing aluminum particles is frequently used. Since the coating has low integral hardness (approximately 50 Hv), the erosion resistance is also relatively low on account of particle erosion or drop-impingement erosion. The low integral hardness is caused above all by the soft aluminum particles in the coating. This has the result that these components regularly have to be de-coated, tested and re-coated.

These components are currently inspected for erosion at specific time intervals and if necessary de-coated and re-coated with same coating system.

SUMMARY

An improvement of the erosion resistance will lead to the possibility of refurbishment intervals being extended and therefore competitive advantages being achieved.

The FIGURE and the description only represent exemplary embodiments of the invention.

In order to increase erosion resistance, it is proposed to replace a coating system, specifically high-temperature lacquer containing aluminum particles from the known art, by a new coating system. The new coating system consists of a soft base layer (Al, Zr, Al—Zr or Al-alloy or Zr-alloy0, which provides cathodic corrosion protection for the substrate, and a hard (TiAlN)/tough (AlTiN) multilayered cover layer with increased corrosion and erosion resistance.

Therefore, the new coating system will provide increased erosion resistance, wherein the corrosion protection is maintained in the same way as the current coating system.

A further advantage is that the impact energy of the particles or water drops in the AlTiN-layer with higher toughness is "absorbed", and together with the harder TiAlN-layer as a multilayered coating system the erosion resistance of the coated components is increased.

Further advantages of such coatings are:

base layer and cover layer can be implemented in a coating process (such as PVD, sputtering, etc.).

the de-coating, if necessary, can be carried out chemically since the base layer alone has very low corrosion resistance.

The proposed coating system has a soft base layer as cathodic corrosion protection and a hard cover layer as erosion protection. Applied together, such layers constitute a synergy effect. The soft layer will "absorb" the impact energy of the particles/drops and therefore the erosion resistance of the cover layer becomes still higher and the hard cover layer has increased corrosion resistance and therefore protects the base layer and the substrate against corrosive action.

Consequently, a coating can be applied by using PVD-coating processes, wherein the coating thickness can be between 10 μm and 20 μm and so remains true to the contour of the component.

A heat treatment of the coating is not necessary.

The roughness of the PVD-coatings is known to be low, which will bring advantages from the aerodynamic point of view.

BRIEF DESCRIPTION

Some of the embodiments will be described in detail, with references to the following FIGURES, wherein like designations denote like members, wherein:

The FIGURE shows a coating 20 according to embodiments of the invention, which is used especially in the case of compressor blades of turbines, particularly gas turbines.

DETAILED DESCRIPTION

A component 1 with the protective coating system 20 has a metallic substrate 4.

However, a substrate 4 can also consist of CMC or CFK.

The material of the substrate 4 is steel as is also used in the case of compressor blades of turbines, gas turbines or for compressors.

An aluminiferous or zirconiferous sub-layer 7 is applied directly to the surface 5 of the substrate 4. There is only one sub-layer 7.

The sub-layer 7 can comprise only aluminum (Al) or an aluminum alloy or an aluminum-zirconium alloy (Al—Zr) or only zircon (Zr) or a zirconium alloy.

The sub-layer 7 exists at least partially as a diffusion layer.

A TiAlN layer 11 and an AlTiN layer 12 are applied as the outermost layer.

Multiple layers consisting of TiAlN-layers 11, 11' and AlTiN-layers 12, 12' are applied alternately.

Only TiAlN and AlTin are used.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A protective coating system, which has a bottom aluminiferous or zirconiferous sub-layer on a substrate, wherein the sublayer is at least one of directly on and in the substrate, wherein the sub-layer comprises only aluminum or an aluminum-zirconium alloy or only zircon and includes an outer multilayered-cover layer consisting of alternating TiAlN and AlTiN layers, which has been applied by PVD.

2. The protective coating system as claimed in claim 1, wherein the sub-layer comprises a diffusion layer.

3. The protective coating system as claimed in claim 1, wherein the substrate is steel.

4. A compressor blade component, comprising:
a substrate; and
a protective coating system, wherein the protective coating system comprises a bottom sub-layer wherein the bottom sub-layer is an aluminiferous or zirconiferous sub-layer, wherein the bottom sub-layer comprises only aluminum or an aluminum-zirconium alloy or only zircon, and wherein the protective coating system comprises an outer multilayered cover layer consisting of alternating TiAlN and AlTiN layers, which has been applied by PVD.

5. The compressor blade component as claimed in claim 4, in which the sub-layer is at least one of arranged directly on and in the substrate.

6. The compressor blade component as claimed in claim 4, in which the sub-layer comprises a diffusion layer.

7. The compressor blade component as claimed in claim 4, wherein the substrate is steel.

8. A method comprising:
providing a substrate, wherein the substrate is a compressor blade;
applying a sub-layer to the substrate, wherein the sub-layer is an aluminiferous or zirconiferous sub-layer and comprises only aluminum or an aluminum-zirconium alloy or only zircon; and
applying an outer multilayered cover layer consisting of alternating TiAlN and AlTiN layers on top of the sub-layer, wherein the outer multilayered cover layer is applied by PVD.

* * * * *